(12) United States Patent
Kouya

(10) Patent No.: US 8,125,794 B2
(45) Date of Patent: Feb. 28, 2012

(54) MULTILAYER PRINTED WIRING BOARD AND ELECTRONIC DEVICE USING THE SAME

(75) Inventor: Kenji Kouya, Kawasaki (JP)

(73) Assignee: NEC Infrontia Corporation, Kawasaki-Shi (JP)

( * ) Notice: Subject to any disclaimer, the term of this patent is extended or adjusted under 35 U.S.C. 154(b) by 344 days.

(21) Appl. No.: 12/405,813

(22) Filed: Mar. 17, 2009

(65) Prior Publication Data

US 2009/0237902 A1 Sep. 24, 2009

(30) Foreign Application Priority Data

Mar. 19, 2008 (JP) ................................. 2008-070542

(51) Int. Cl.
*H05K 1/11* (2006.01)
*H05K 1/14* (2006.01)
(52) U.S. Cl. ......... 361/794; 361/763; 361/766; 361/795
(58) Field of Classification Search .......... 361/763–766, 361/782–784, 792–795
See application file for complete search history.

(56) References Cited

U.S. PATENT DOCUMENTS

| | | | |
|---|---|---|---|
| 5,870,274 A * | 2/1999 | Lucas | 361/311 |
| 6,483,714 B1 * | 11/2002 | Kabumoto et al. | 361/760 |
| 6,557,154 B1 * | 4/2003 | Harada et al. | 716/115 |

FOREIGN PATENT DOCUMENTS

JP 11-54860 A 2/1999

* cited by examiner

*Primary Examiner* — Tuan T Dinh
(74) *Attorney, Agent, or Firm* — Sughrue Mion, PLLC

(57) ABSTRACT

The invention provides a multilayer printed wiring board including: a power supply wiring layer and a ground wiring layer provided so as to oppose each other via an insulation layer; mounted integrated circuits; and decoupling capacitors mounted in proximity to the integrated circuits and connected between the power supply wiring layer and the ground wiring layer to absorb noise from the integrated circuits. The power supply wiring layer includes through holes for connecting the decoupling capacitors to the power supply wiring layer and has a polygonal form formed by straight lines which link some of the through holes.

3 Claims, 5 Drawing Sheets

MULTILAYER PRINTED WIRING BOARD AND ELECTRONIC DEVICE USING THE SAME

INCORPORATION BY REFERENCE

This application is based upon and claims the benefit of priority from Japanese patent application No. 2008-070542, filed on Mar. 19, 2008, the disclosure of which is incorporated herein in its entirety by reference.

TECHNICAL FIELD

The present invention relates to a multilayer printed wiring board and an electronic device which makes use of the same, and in particular to a multilayer printed wiring board used as a circuit board of an electronic device.

BACKGROUND ART

One technique for printed wiring boards which are used in a variety of electronic devices is to provide decoupling capacitors between a power supply wiring layer and a ground wiring layer in order to reduce electromagnetic radiation caused by the power supply system (see Japanese Patent Laid-Open No. H11-54860). FIG. 3 and FIG. 4 are drawings for explaining an example of such a technique. FIG. 3 is a transparent plan view of a multilayer printed wiring board 1, and FIG. 4 is a cross-sectional view of a central portion of the multilayer printed wiring board 1 of FIG. 3. Note that, in both drawings, the same symbols are used to denote the same portions.

As shown in FIG. 4, the multilayer printed wiring board 1 has a multilayer structure including a first insulation layer 10, a ground wiring layer 2, a second insulation layer 11, a power supply wiring layer 3, and a third insulation layer 12 which form layers in the stated order. Thus, the power supply wiring layer 3 and the ground wiring layer 2 oppose each other via the second insulation layer 11.

Further, a signal wiring layer 13 is formed on the first insulation layer 10 and a signal wiring layer 14 is formed on the third insulation layer 12. The ground wiring layer 2 (portion shown with hatching sloping downwards from right to left in FIG. 3) and the power supply wiring layer 3 (portion shown with hatching sloping downwards from left to right in FIG. 3) are provided over nearly the entire area of printed wiring board 1 in an arrangement known as "solid" wiring (all-over printed wiring).

As shown in FIG. 3, integrated circuits 5 to 8 are mounted on the multilayer printed wiring board 1. In proximity to the integrated circuits 5 to 8, decoupling capacitors 9a to 9l for suppressing the noise of each circuit, are mounted. Further, a plurality of decoupling capacitors 110a to 110l are mounted at a perimeter region of the multilayer printed wiring board 1.

In order to supply power to the power supply wiring layer 3, a power supply connector 4 is mounted at a bottom left-hand edge portion of the multilayer printed wiring board 1. The power supply connector 4, as shown in detail in FIG. 5, includes a power supply through hole 41 and a ground through hole 42. The power supply through hole 41 is electrically connected to the power supply wiring layer 3 and the ground through hole 42 is electrically connected to the ground wiring layer 2.

Here, as can be seen in FIG. 6, each of the decoupling capacitors 9a to 9l (which are collectively denoted 9) mounted around the each of the integrated circuits 5 to 8 has one end connected to the power supply wiring layer 3 by power supply wiring 53 and the power supply through hole 51. The other end of each capacitor 9 is connected to the ground wiring layer 2 by ground wiring 54 and ground through hole 52.

Further, as can be seen from FIG. 7, each of the decoupling capacitors 110a to 110l (collectively denoted 110) mounted in proximity to the printed wiring board 1 has one end connected to the power supply wiring layer 3 by power supply wiring 163 and power supply through hole 161. The other end of each of the capacitors 110 is connected to the ground wiring layer 2 by ground wiring 164 and ground through hole 162.

The power supply wiring layer 3 is given a solid wiring form within the printed wiring board 1, so that the power supply through hole 41 of the power supply connector 4 which is to form a power supply source and the power supply through holes 51 and 161 which are to form power supply destinations, are all included in an area covered by the wiring layer 3. Similarly, the ground wiring layer 2 is given a solid wring form within the printed wiring board 1 so that the ground through hole 42 of the power supply connector 4 and the ground through holes 52 and 162 of the decoupling capacitors, are all included in an area covered by the wiring layer 2.

With this construction, when the integrated circuits 5 to 8 mounted on the multilayer printed wiring board 1 operate, power supply current flows in the power supply wiring layer 3 and the return path current of the power supply current flows in the ground wiring layer 2. Thus, as a result of the currents flowing in the wiring layers 2 and 3 which form parallel plates, resonance noise occurs between the power supply wiring layer 3 and the ground wiring layer 2.

Since the power supply wiring layer 3 includes the power supply through hole 41 of the power supply connector 4 which forms the power supply source and the power supply through holes 51 which form the power supply destinations and extends to a perimeter of the substrate, the resonance noise is transmitted to the perimeter of the power supply wiring layer 3, and appears as a noise voltage between the power supply wiring layer 3 and the ground wiring layer 2. As a consequence, problems such as EMI (Electro-Magnetic Interference) radiation and the like occur.

In order to absorb the noise voltage between the power supply wiring layer 3 and the ground wiring layer 2, the decoupling capacitors 110a to 110l are mounted in the perimeter portion of the printed wiring board 1. One end of each of the capacitors 110 is connected to the power supply wiring layer 3 and the other end is connected to the ground wiring layer 2.

As described above with reference to FIG. 3 and FIG. 4, in the multilayer printed wiring board, the power supply wiring layer 3 including all the power supply through holes (51 in FIG. 6 and 161 in FIG. 7) which form the power supply destinations is provided with a solid wiring configuration extending, within permitted range, over nearly the entire area of the multilayer printed wiring board 1. To provide a bypass for the noise voltage resulting from resonance between the power supply wiring layer 3 and the ground wiring layer 2, a large number of dedicated decoupling capacitors 110a to 110l must be provided in the peripheral region of the power supply wiring layer 3. This configuration therefore has the disadvantage of a large number of components.

SUMMARY

An exemplary object of the invention is to provide a multilayer printed wiring board and an electronic device which makes use of the same for which it is possible to suppress an increase in a number of decoupling capacitor components.

An exemplary aspect of the invention is a multilayer printed wiring board including: a power supply wiring layer and a ground wiring layer provided so as to oppose each other via an insulation layer; integrated circuits mounted on the wiring board; and decoupling capacitors mounted in proximity to the integrated circuits respectively and connected between the power supply wiring layer and the ground wiring layer to absorb noise from the integrated circuits respectively, wherein the power supply wiring layer includes through holes for connecting the decoupling capacitors to the power supply wiring layer and has a polygonal form formed by straight lines which link at least some of the through holes.

An electronic device according to the present invention makes use of the above-described multilayer printed wiring board.

EXEMPLARY EMBODIMENTS

Figure 1:
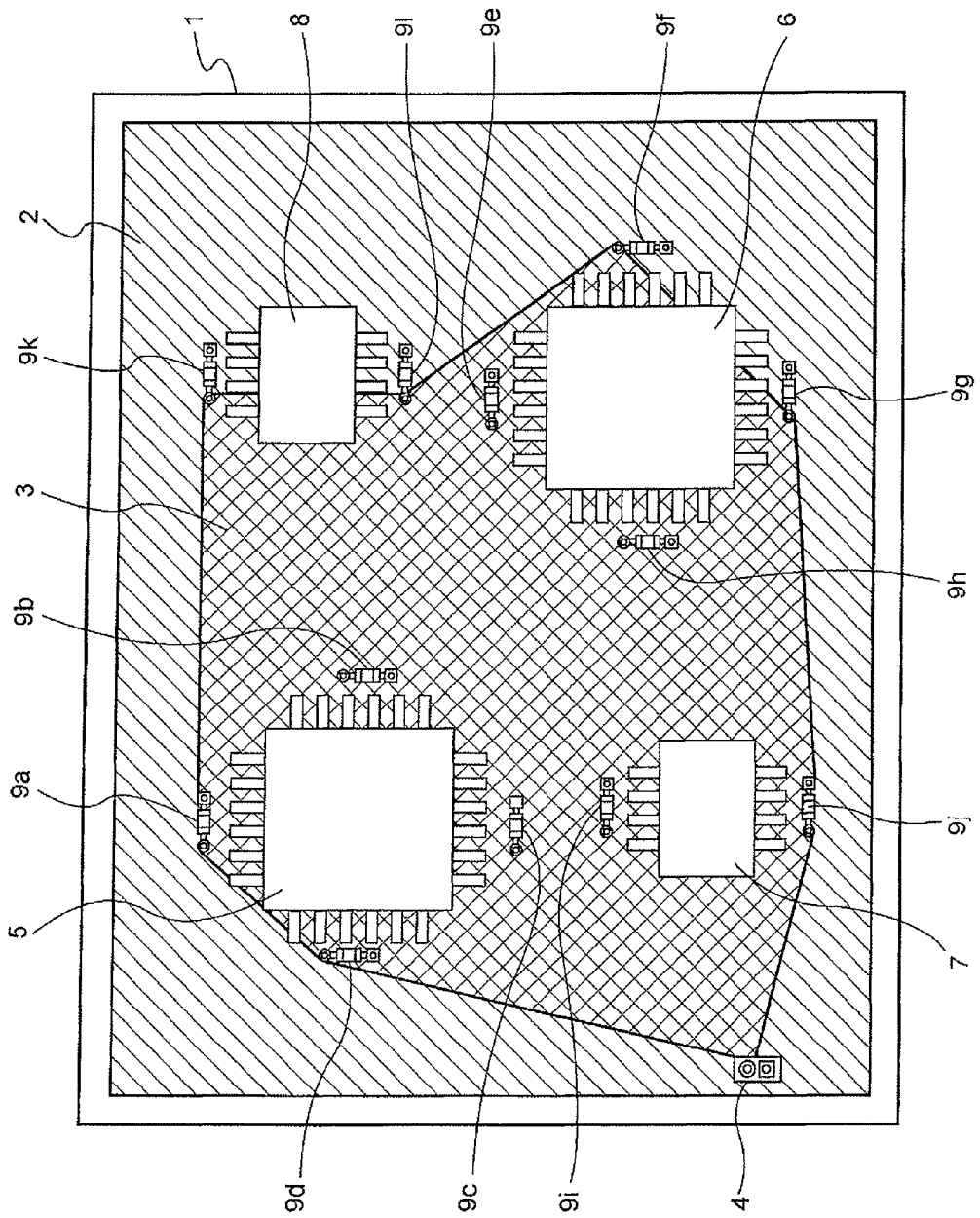
FIG. 1 is a transparent plan view showing a first exemplary embodiment of the present invention.
Figure 3:
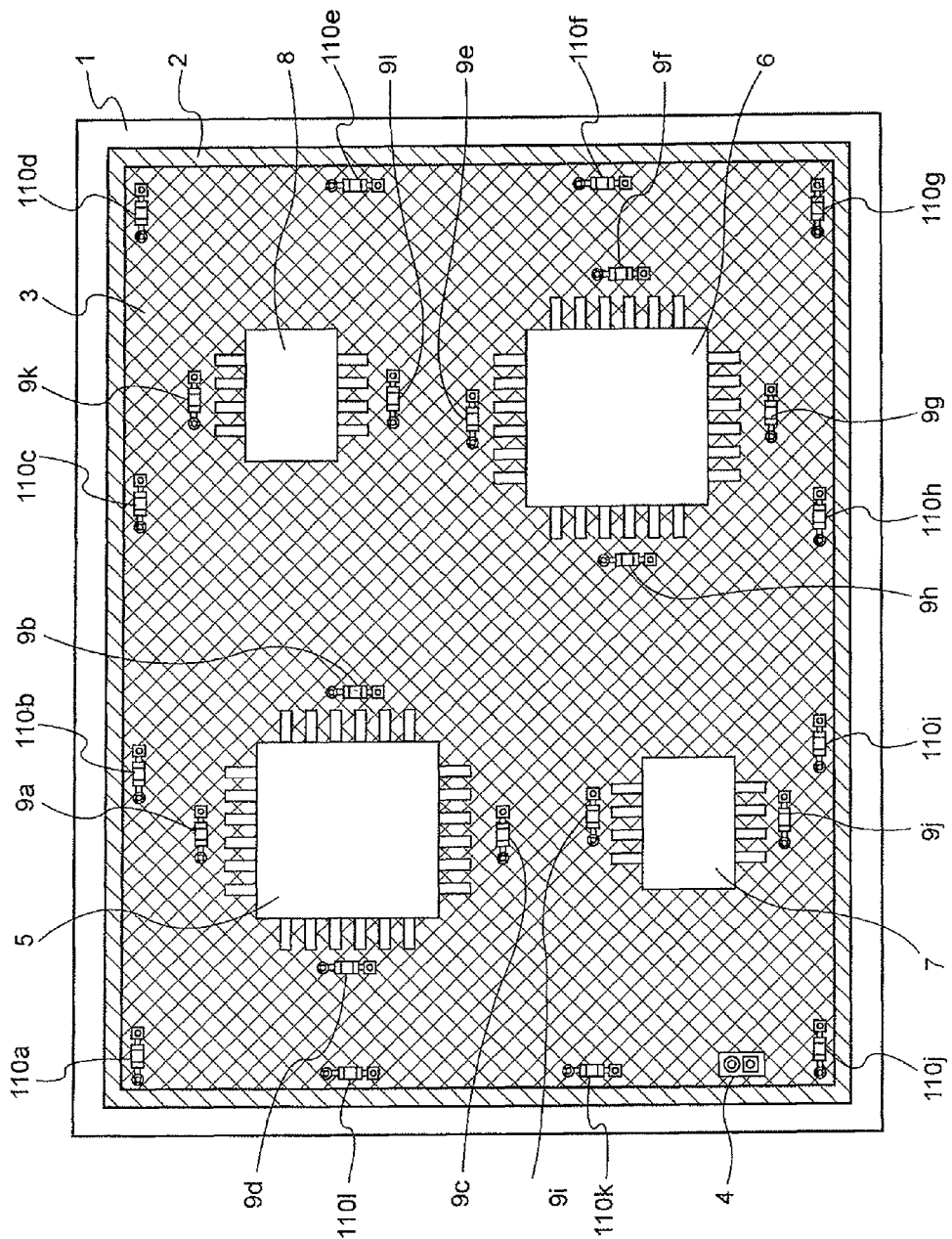
FIG. 3 is a transparent plan view showing a related art example.
Figure 4:
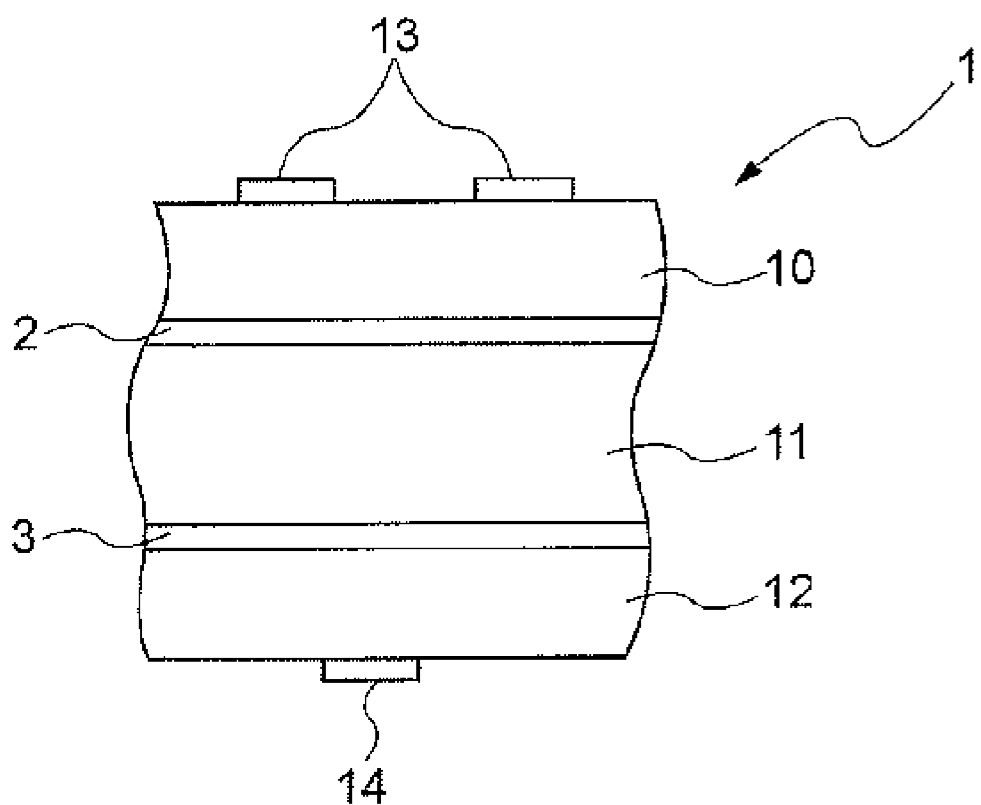
FIG. 4 is a cross-sectional view of a central portion of the related art of the configurations shown in FIGS. 1 to 3.

The following describes exemplary embodiments of the present invention with reference to the drawings. FIG. 1 shows a first embodiment of the present invention, and, like FIG. 3, is a transparent plan view of a multilayer printed wiring board 1. In FIG. 1, the same symbols are used to denote portions identical to those in FIG. 3. Further, a cross-sectional view of a central region of the multilayer printed wiring board 1 is shown in FIG. 4.

With reference FIG. 1, it can be seen that integrated circuits 5 to 8 are mounted on the multilayer printed wiring board 1. Decoupling capacitors 9a to 9l for suppressing noise from the integrated circuits 5 to 8 are provided in the regions surrounding the respective integrated circuits 5 to 8. Further, a power supply connector 4 which forms a power supply source is mounted at a lower left edge portion of the multilayer printed wiring board 1.

Figure 5:
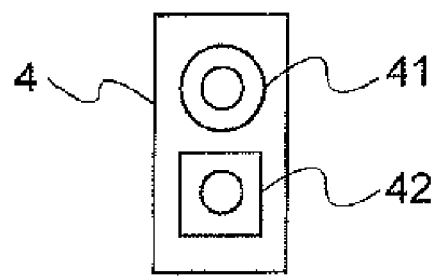
FIG. 5 is a detailed view of a power supply connector 4 of FIGS. 1 to 3.
Figure 6:
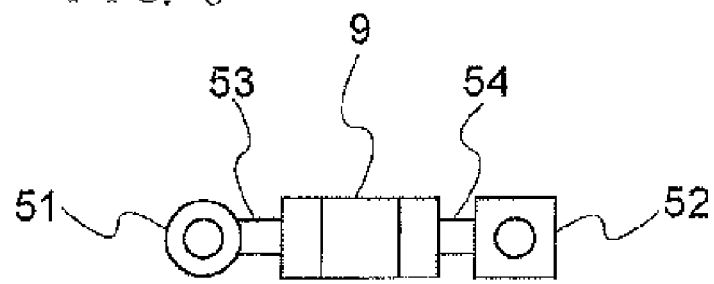
FIG. 6 is a detailed view of the related art decoupling capacitors 9a 25 to 9l of FIGS. 1 to 3.
Figure 7:
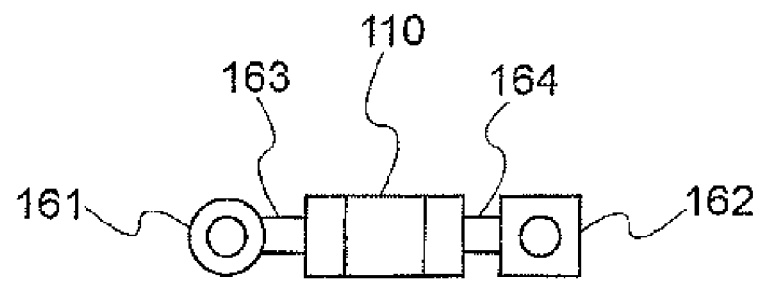
FIG. 7 is a detailed view of the related art decoupling capacitors 110a to 110l of FIG. 3.

A ground wiring layer 2 (indicated by the hatching sloping downwards from right to left), like the example shown in FIG. 3, has a solid wiring configuration. The ground wiring layer 2 extends, within a permissible range, over nearly an entire area of the printed wiring board 1 as an internal layer of the multilayer printed wiring board 1. The power supply wiring layer 3 (indicated by the hatching sloping downwards from left to right) also has a solid wiring configuration. In contrast to the ground wiring layer 2, however, the power supply wiring layer 3 is limited to the minimum area necessary for the inclusion of the power supply through hole 41 (see FIG. 5) of the power supply connector 4 which forms the power supply source and the power supply through holes 51 (see FIG. 6) of the decoupling capacitors 9a to 9l which form the power supply destinations.

In the present embodiment, the power supply wiring 3 has a solid wiring configuration in which a polygon is formed by straight lines linking the power supply through holes of the capacitors 9a and 9k, the capacitors 9k and 9l, the capacitors 9l and 9f, the capacitors 9f and 9g, the capacitors 9g and 9j, the capacitor 9j and the power supply connector 4, the power supply connector 4 and the capacitor 9d, and the capacitors 9d and 9a.

Thus, the power supply wiring layer 3 has a polygonal form having an area which approximates to the minimum area which includes all of the power supply through holes of the power supply source and the power supply destination. Through use of this arrangement, some of the decoupling capacitors (9a, 9k, 9l, 9f, 9g, 9j, and 9d in the present embodiment) mounted to suppress the noise from the integrated circuits 5 to 8 are provided at the periphery of the power supply wiring layer 3.

Hence, the same decoupling capacitors provide a bypass for the noise voltage generated due to resonance between the power supply wiring layer 3 and the ground wiring layer 2. Consequently, it is possible to eliminate the need for the decoupling capacitors 110a to 110l specially mounted at the periphery of the power supply wiring layer 3 shown in FIG. 3 and suppress the noise between the power supply and ground layers.

With this configuration, when the integrated circuits 5 to 8 mounted on the multilayer printed wiring board 1 are operated, power supply current flows in the power supply wiring layer 3 and return path current of the power supply current flows in the ground wiring layer 2. When current flows between the power supply wiring layer 3 and the ground wiring layer 2, noise voltage occurs due to the resonance between the parallel-plate power supply wiring layer 3 and the ground wiring layer 2 which form parallel plates.

The power supply wiring layer 3 has a polygonal form having an area which approximates to the minimum area that includes the power supply through hole 41 of the power supply connector 4 which forms the power supply source and all the power supply through holes 51 of the decoupling capacitors 9 which form the power supply destinations. The decoupling capacitors 9 for absorbing noise generated in the integrated circuits 5 to 8 are connected around the power supply wiring layer 3. Hence, the noise voltage generated due to the resonance between the power supply wiring layer 3 and the ground wiring layer 2 is bypassed and absorbed by the decoupling capacitors 9.

Figure 2:
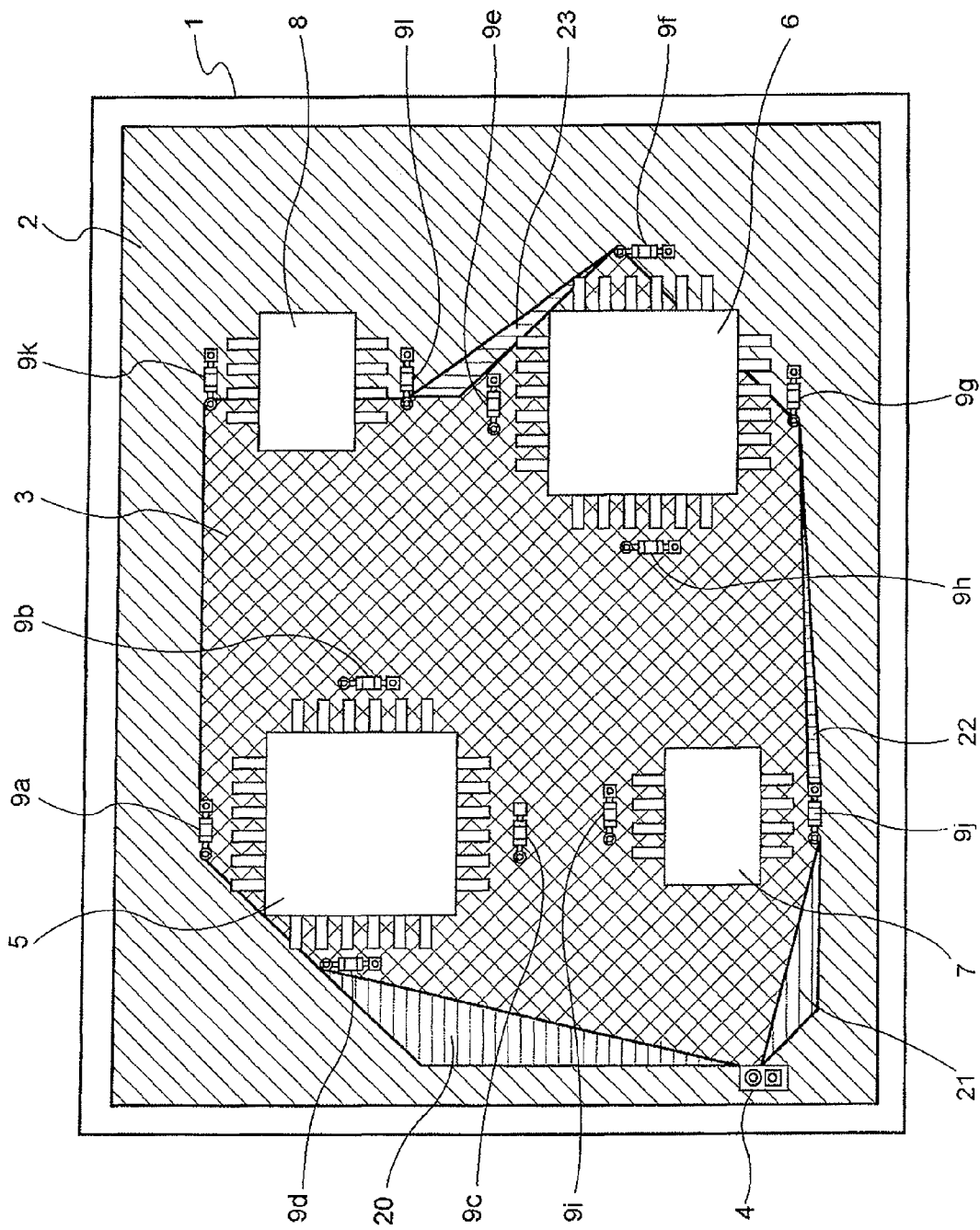
FIG. 2 is a transparent plan view showing a second exemplary embodiment of the present invention.

FIG. 2 shows a second embodiment of the present invention, and, like FIG. 1, is a transparent plan view of the multilayer printed wiring board 1. In FIG. 2, the same symbols are used to denote the portions that are identical to those in FIG. 1.

The straight lines constructing the polygon of the power supply wiring layer 3 of the present embodiment differ from the straight lines having freely tilt angles as shown in FIG. 1. The power supply wiring layer 3 of the present embodiment has two straight lines which are parallel to edges of the multilayer printed wiring board 1 (i.e. the horizontal and vertical lines in FIG. 2), and other straight lines with tilt angles which are set at 45° to the horizontal and vertical lines. In comparison to the exemplary embodiment of FIG. 1, the exemplary embodiment of FIG. 2 has an area which is increased by the portions 20 and 21 which are indicated horizontal hatching and reduced by the portions 22 and 23 which are indicated by the vertical hatching.

The reason for making the lines with the tilt angle 45° rather than allowing the angles to be set freely is that setting wiring lines with the tilt angle 45° is normal when printing wiring, and therefore convenient from a design point of view. However, the tilt angle 45° setting is not limiting and another tilt angle may be used.

Note, that in FIG. 11 of the above-mentioned Japanese Patent Laid-Open No. H11-54860 shows a configuration in which the area of a power supply wiring layer 11 is smaller than the area of a ground wiring layer 12 and decoupling capacitors are mounted at a peripheral portion of the power supply wiring layer 11. In this example, however, decoupling capacitors must be provided in peripheral portions of the power supply wiring layer 11, and the number of components is not reduced.

In the present invention, the decoupling capacitors used for suppressing noise from the integrated circuits are also used to suppress resonance noise from between the power supply wiring layer and the ground wiring layer, and consequently, dedicated decoupling capacitors for suppressing the resonance noise are not required.

The present invention is applicable to multilayer printed wiring boards having a power supply wiring layer and a ground wiring layer as internal layers provided so as to be parallel and oppose each other. It is also clear than the present invention can be widely applied to the multilayer printed wiring boards of electronic devices such as information processing apparatus and the like.

According to the present invention, the size of the power supply wiring layer is set to allow the noise voltage generated between the power supply wiring layer and the ground wiring layer to be absorbed by the decoupling capacitors for suppressing noise from the mounted integrated circuits. This configuration has an advantage in that the decoupling capacitors for absorbing the noise voltage resulting from resonance between the power supply wiring layer and the ground wiring layer are no longer required.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A multilayer printed wiring board comprising:
a power supply wiring layer and a ground wiring layer provided so as to oppose each other via an insulation layer;
integrated circuits mounted on the wiring board; and
decoupling capacitors mounted in proximity to the integrated circuits respectively and connected between the power supply wiring layer and the ground wiring layer to absorb noise from the integrated circuits respectively, wherein
the power supply wiring layer includes through hat connect the decoupling capacitors to the power supply wiring layer, and the power supply wiring layer comprises a polygonal form formed by straight lines which link at least some of the through holes;
wherein the straight lines of the polygonal form comprise first straight lines which are parallel to sides of the multilayer printed wiring board and second straight lines which are set at 45° with respect to the first straight lines.

2. The multilayer printed wiring board according to claim 1, wherein the decoupling capacitors configured to absorb noise from the integrated circuits are configured to absorb noise from between the power supply wiring layer and the ground wiring layer.

3. An electronic device using the multilayer printed wiring board according to claim 1.

* * * * *

UNITED STATES PATENT AND TRADEMARK OFFICE
CERTIFICATE OF CORRECTION

| | | |
|---|---|---|
| PATENT NO. | : 8,125,794 B2 | Page 1 of 1 |
| APPLICATION NO. | : 12/405813 | |
| DATED | : February 28, 2012 | |
| INVENTOR(S) | : Kenji Kouya | |

It is certified that error appears in the above-identified patent and that said Letters Patent is hereby corrected as shown below:

In the Claims

Column 6, Line 19: In Claim 1, delete "hat" and insert -- holes that --

Signed and Sealed this
Twenty-third Day of September, 2014

Michelle K. Lee
*Deputy Director of the United States Patent and Trademark Office*